(12) United States Patent
Chou et al.

(10) Patent No.: US 9,056,762 B2
(45) Date of Patent: Jun. 16, 2015

(54) CAPACITIVE SENSORS AND METHODS FOR FORMING THE SAME

(71) Applicant: Taiwan Semiconductor Manufacturing Company, Ltd., Hsin-Chu (TW)

(72) Inventors: Bruce C. S. Chou, Hsin-Chu (TW); Jung-Kuo Tu, Hsin-Chu (TW); Chen-Chih Fan, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/244,029

(22) Filed: Apr. 3, 2014

(65) Prior Publication Data

US 2014/0213008 A1    Jul. 31, 2014

Related U.S. Application Data

(62) Division of application No. 13/452,037, filed on Apr. 20, 2012, now Pat. No. 8,748,999.

(51) Int. Cl.
| | |
|---|---|
| *H01L 29/84* | (2006.01) |
| *H01L 21/02* | (2006.01) |
| *H01L 21/306* | (2006.01) |
| *H01L 21/20* | (2006.01) |
| *H01L 21/28* | (2006.01) |
| *B81C 1/00* | (2006.01) |
| *G01P 15/125* | (2006.01) |
| *H01G 5/18* | (2006.01) |
| *H01L 49/02* | (2006.01) |

(52) U.S. Cl.
CPC ........... *B81C 1/00158* (2013.01); *G01P 15/125* (2013.01); *H01L 28/60* (2013.01); *H01G 5/18* (2013.01)

(58) Field of Classification Search
CPC ..... H01L 29/84; H01L 27/1203; H01L 28/10; H01L 28/40; H01L 21/2007
USPC .............. 438/53, 50, 396; 257/415, 416, 419, 257/420
See application file for complete search history.

(56) References Cited

U.S. PATENT DOCUMENTS

| | | | |
|---|---|---|---|
| 6,388,299 B1 | 5/2002 | Kang et al. | |
| 6,465,301 B1 * | 10/2002 | Cheong .......................... | 438/255 |
| 8,130,979 B2 | 3/2012 | Harney et al. | |
| 8,243,962 B2 | 8/2012 | Qiao | |
| 8,270,634 B2 | 9/2012 | Harney et al. | |
| 8,309,386 B2 | 11/2012 | Weigold | |
| 8,351,632 B2 | 1/2013 | Harney et al. | |
| 8,358,793 B2 | 1/2013 | Weigold | |
| 8,477,983 B2 | 7/2013 | Weigold et al. | |
| 8,590,136 B2 * | 11/2013 | Yang et al. ...................... | 29/594 |
| 2006/0170012 A1 | 8/2006 | Larmer | |
| 2006/0291674 A1 * | 12/2006 | Gong et al. .................... | 381/174 |
| 2007/0034976 A1 * | 2/2007 | Barzen et al. .................. | 257/415 |

(Continued)

*Primary Examiner* — Shaun Campbell
*Assistant Examiner* — Thai T Vuong
(74) *Attorney, Agent, or Firm* — Slater & Matsil, L.L.P.

(57) ABSTRACT

A device includes a semiconductor substrate, and a capacitive sensor having a back-plate, wherein the back-plate forms a first capacitor plate of the capacitive sensor. The back-plate is a portion of the semiconductor substrate. A conductive membrane is spaced apart from the semiconductor substrate by an air-gap. A capacitance of the capacitive sensor is configured to change in response to a movement of the polysilicon membrane.

20 Claims, 12 Drawing Sheets

(56) References Cited

U.S. PATENT DOCUMENTS

| | | |
|---|---|---|
| 2009/0041270 A1 | 2/2009 | Schrank et al. |
| 2009/0064785 A1 | 3/2009 | Fukuda et al. |
| 2010/0084721 A1* | 4/2010 | Wu et al. .................... 257/415 |
| 2010/0207217 A1* | 8/2010 | Zuniga-Ortiz et al. ....... 257/415 |
| 2010/0276766 A1* | 11/2010 | Tang et al. .................... 257/419 |
| 2010/0285628 A1 | 11/2010 | Martin et al. |
| 2011/0073859 A1* | 3/2011 | Chen et al. ..................... 257/53 |
| 2011/0073967 A1* | 3/2011 | Chen et al. .................... 257/416 |
| 2011/0165720 A1 | 7/2011 | Weigold |
| 2012/0025334 A1 | 2/2012 | Chan et al. |
| 2012/0043627 A1 | 2/2012 | Lin et al. |
| 2012/0091546 A1 | 4/2012 | Langereis et al. |
| 2012/0256237 A1* | 10/2012 | Lakamraju et al. ........... 257/254 |
| 2012/0319174 A1* | 12/2012 | Wang ............................ 257/254 |
| 2012/0319219 A1* | 12/2012 | Diamond et al. .............. 257/416 |
| 2014/0252422 A1* | 9/2014 | Winkler et al. ................ 257/254 |

\* cited by examiner

CAPACITIVE SENSORS AND METHODS FOR FORMING THE SAME

This application is a divisional of U.S. patent application Ser. No. 13/452,037, entitled "Capacitive Sensors and Methods for Forming the Same," filed on Apr. 20, 2012, which application is incorporated herein by reference.

BACKGROUND

Micro-Electro-Mechanical System (MEMS) devices may be used in various applications such as micro-phones, accelerometers, inkjet printers, etc. A commonly used type of MEMS devices includes a capacitive sensor, which utilizes a movable element as a capacitor plate, and a fixed element as the other capacitor plate. The movement of the movable element causes the change in the capacitance of the capacitor. The change in the capacitance may be converted into the change in an electrical signal, and hence the MEMS device may be used as a microphone, an accelerometer, or the like.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

Micro-Electro-Mechanical System (MEMS) devices including capacitive sensors and the methods of forming the same are provided in accordance with various embodiments. The intermediate stages of forming the MEMS devices are illustrated. The variations and the operation of the embodiments are discussed. Throughout the various views and illustrative embodiments, like reference numbers are used to designate like elements.

Figure 1:
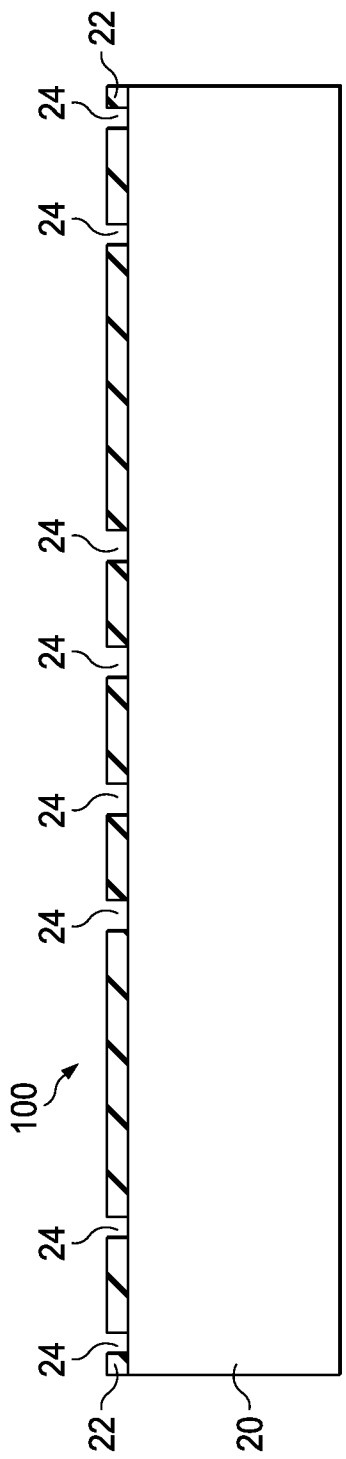
FIGS. 1 through 12B are cross-sectional views of intermediate stages in the manufacturing of capacitive sensors in accordance with some exemplary embodiments.

FIGS. 1 through 12B illustrate cross-sectional views and top views of intermediate stages in the formation of MEMS devices in accordance with various exemplary embodiments. Referring to FIG. 1, wafer 100 is provided. Wafer 100 includes substrate 20, which may include a semiconductor material such as silicon. Substrate 20 may be heavily doped with a p-type or an n-type impurity, for example, to an impurity concentration higher than about $10^{19}/cm^3$. Accordingly, substrate 20 has a low resistivity. Dielectric layer 22 is formed on the top surface of substrate 20. In some embodiments, dielectric layer 22 comprises a material that has a high etching resistance to the etching gases such as vapor HF and etching solutions such as HF-based solutions (Buffer Oxide Etching (BOE) solution, for example). Furthermore, dielectric layer 22 may further have an anti-stiction function due to its low surface energy, and is not easily stuck to polysilicon. In some embodiments, dielectric layer 22 is formed of silicon nitride. Alternatively, dielectric layer 22 is formed of silicon carbide (SiC), diamond-like carbon. Dielectric layer 22 may also be a composite layer comprising a plurality of layers formed of different materials. The thickness of dielectric layer 22 may be between about 1 kÅ and about 10 kÅ, for example. It is appreciated that the dimensions recited throughout the description are examples, and may be changed to different values. The deposition methods include Chemical Vapor Deposition (CVD) methods such as Low-Pressure CVD (LPCVD). In some embodiments, dielectric layer 22 is patterned to form openings 24, through which the underlying substrate 20 is exposed.

Figure 2:
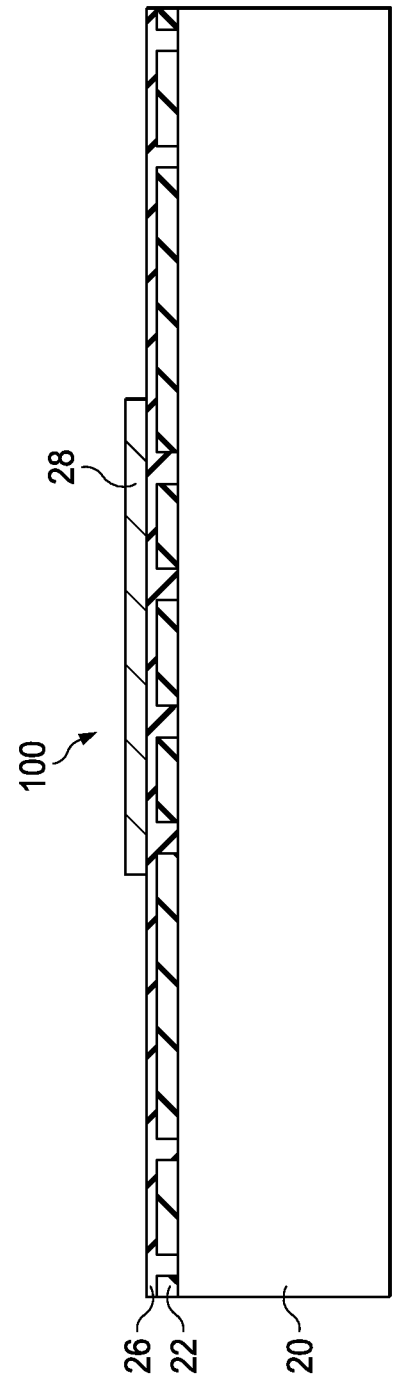

FIG. 2 illustrates the deposition of sacrificial layer 26 over dielectric layer 22. The thickness of sacrificial layer 26 may be between about 0.3 μm m and about 5 μm, for example. The material of sacrificial layer 26 may be selected so that there is a high etching selectivity between sacrificial layer 26 and dielectric layer 22. Accordingly, in subsequent steps, sacrificial layer 26 may be etched without causing the substantial etching of dielectric layer 22. Furthermore, the material of sacrificial layer 26 may be selected so that there is a high etching selectivity between sacrificial layer 26 and polysilicon. In some embodiments, sacrificial layer 26 comprises silicon oxide.

Conductive layer 28 is deposited on sacrificial layer 26, and is then patterned. The remaining portion of conductive layer 28 is referred to as conductive plate 28 hereinafter. In some embodiments, conductive plate 28 comprises polysilicon, although other conductive materials such as metals (for example, aluminum copper), may be used. With the proceeding of the formation of polysilicon, conductive plate 28 may be in-situ doped with a p-type or an n-type impurity to increase its conductivity.

Figure 3:
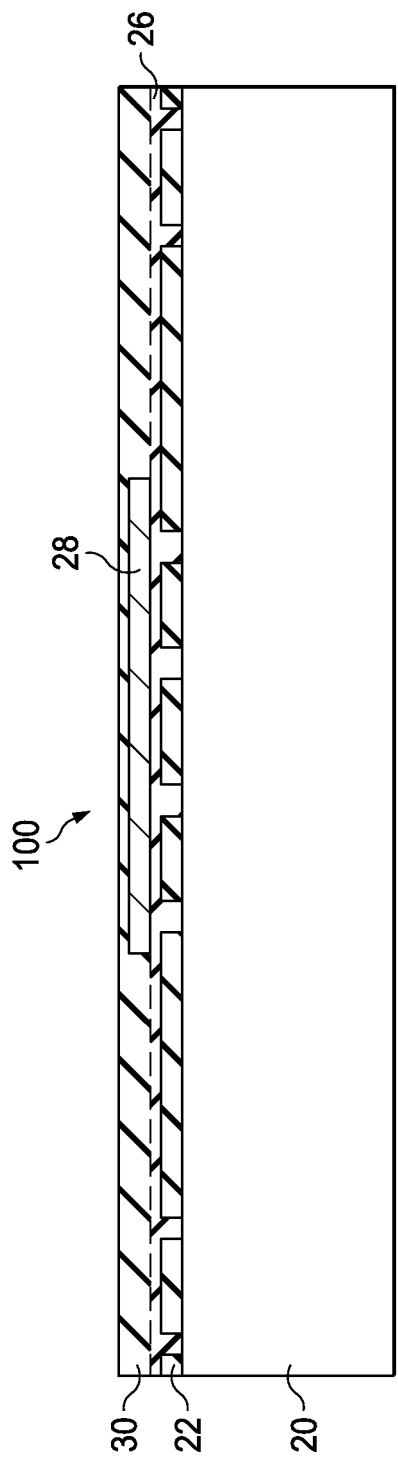
Figure 4:
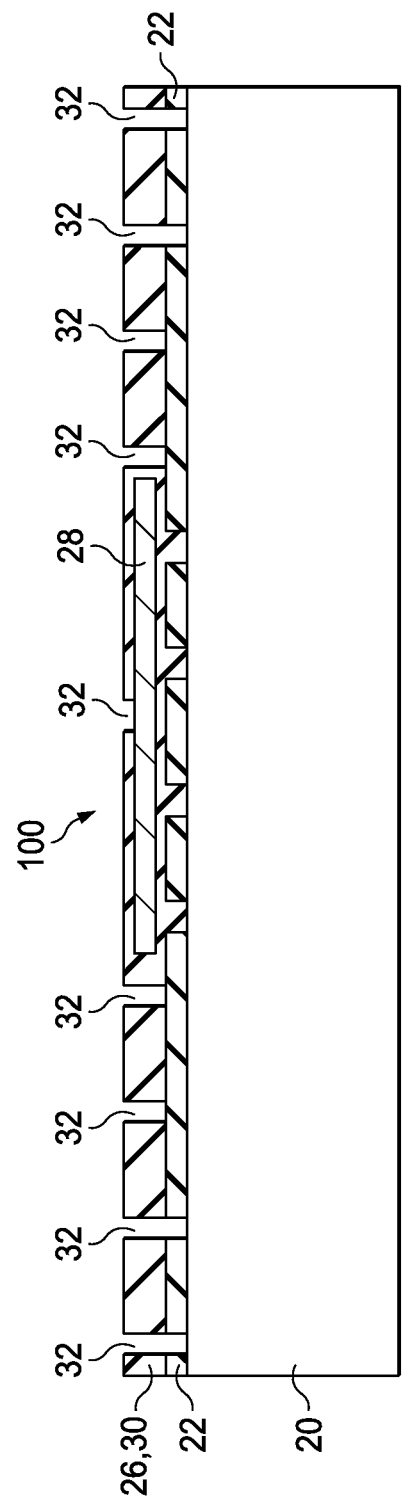

Referring to FIG. 3, an additional sacrificial layer 30 is formed over conductive plate 28 and sacrificial layer 26. Sacrificial layers 26 and 30 may be formed of essentially the same material such as silicon oxide, and are referred to in combination as sacrificial layer 26/30 hereinafter. To achieve better surface flatness and morphology, a Chemical Mechanical Polish (CMP) step may further be adopted to level the top surface of sacrificial layer 30. Next, as shown in FIG. 4, openings 32 are formed in sacrificial layers 26 and 30. Some of openings 32 are aligned to openings 24 in FIG. 1, and one of openings 32 is over conductive plate 28. Accordingly, conductive plate 28 is exposed through the respective opening 32. In some embodiments, there is only a single opening 32 over conductive plate 28, although more may be formed.

Figure 5A:
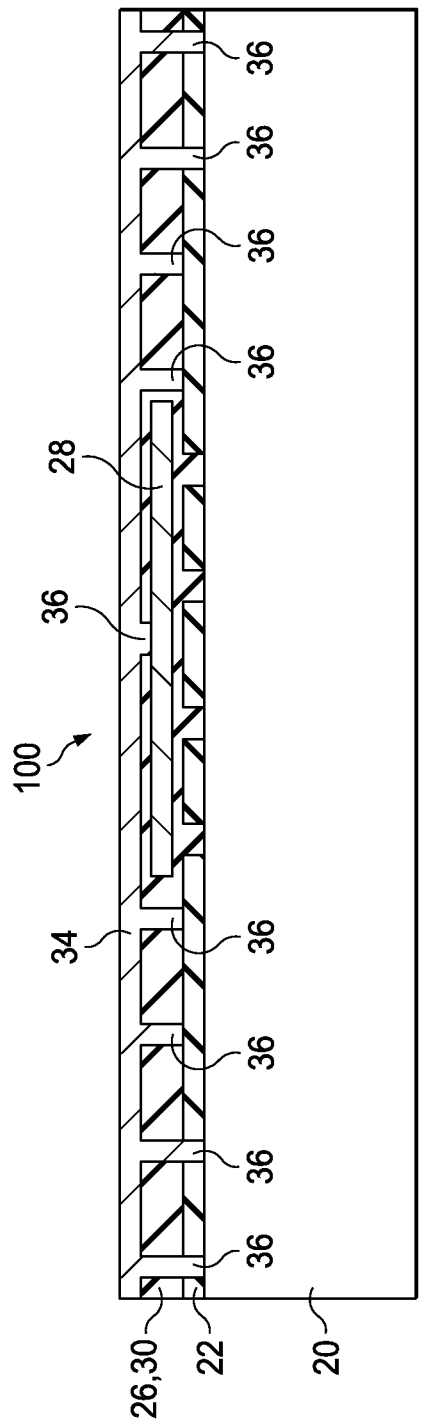
Figure 5B:
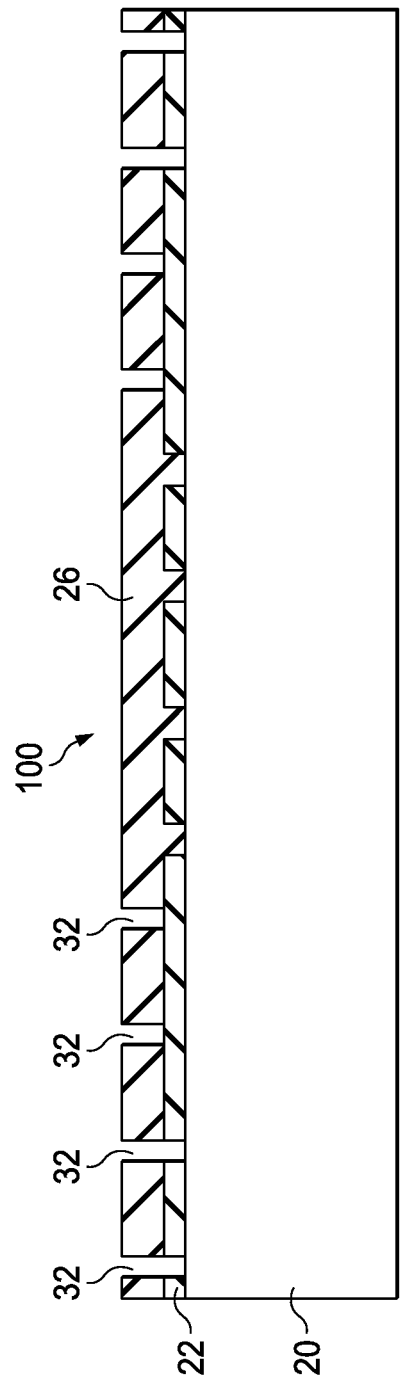

Next, referring to FIG. 5A, a conductive material, which includes conductive layer 34 and conductive vias 36, is formed. Conductive vias 36 fill openings 32, and conductive layer 34 is formed over sacrificial layer 30. A planarization such as a CMP may be performed to planarize the top surface of conductive layer 34. The thickness of conductive layer 34 may be between about 1 μm and about 3 μm, for example. A thin dielectric layer (which is not shown in the figure), for example, a silicon oxide layer, may further be formed on the conductive layer 34 and partially removed from where bond layer 38 (in FIG. 6A) contacts conductive layer 34. Conductive layer 34 is connected to conductive plate 28 through the respective via 36 therebetween. In some embodiments, conductive layer 34 and conductive vias 36 are formed of polysilicon, and are in-situ doped to reduce its resistivity. The conductivity types of conductive layers 28 and 34 are the same as the conductivity type of substrate 20. This may result in Ohmic contacts, rather than PN junctions, are formed between conductive layers 28 and 34 and substrate 20. Conductive plate 28, conductive layer 34, and conductive vias 36 may be formed using Low Pressure Chemical Vapor Deposition (LPCVD), for example. After the formation of conductive layer 34 and conductive vias 36, an annealing may be performed, for example, at temperatures higher than about 900° C., to release the stress in the respective structure as sown in FIG. 5A.

Figure 6A:
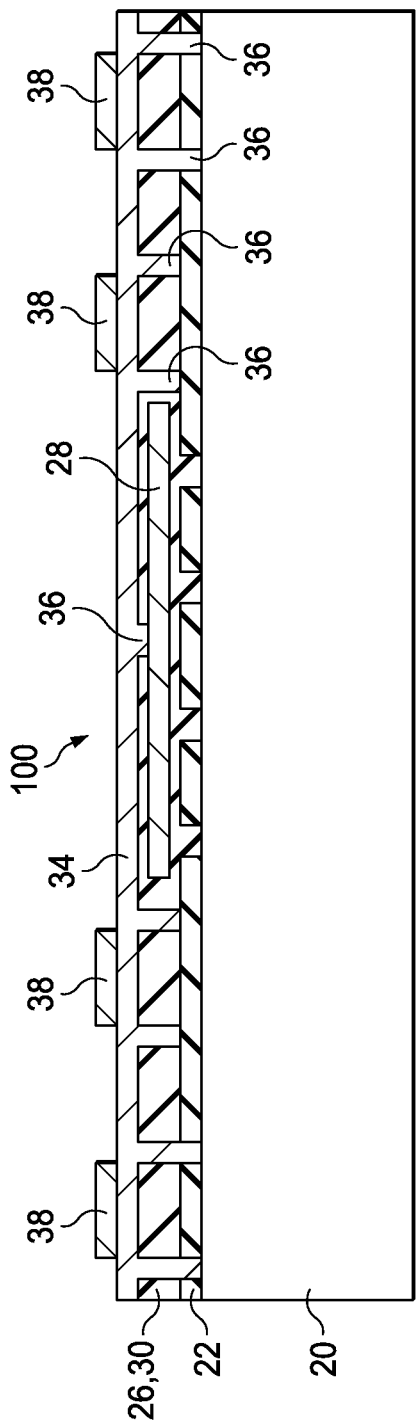

FIG. 6A further illustrates the formation of bond layer 38, which may be formed, for example, using Physical Vapor Deposition (PVD) and a lithography step. In some embodiments, bond layer 38 is an aluminum layer. Other materials may be added into bond layer 38. For example, bond layer 38 may include about 0.5 percent copper and about 99.5 percent aluminum. In alternative embodiments, bond layer 38 includes about 97.5 percent aluminum, about 2 percent silicon, and about 0.5 percent copper. In yet other embodiments, bond layer 38 may be a substantially pure germanium layer, an indium layer, a gold layer, or a tin layer. The materials of bond layer 38 are capable of forming a eutectic alloy with the material of bond layer 48 (not shown in FIG. 1, please refer to FIG. 8). Accordingly, the material of bond layer 38 and the material of bond layer 48 are selected correspondingly. For example, in the embodiments wherein bond layer 38 includes aluminum, the material of bond layer 48 may be selected from germanium, indium, gold, combinations thereof, and multilayers thereof. Alternatively, in the embodiments wherein metal bond layer 38 includes tin, bond layer 48 may include gold. The thickness of bond layer 38 may be greater than about 0.3 μm, for example. Bond layer 38 may be patterned into a plurality of portions.

FIGS. 2 through 6A illustrate some embodiments in which conductive layers 28 and 34 are formed to connect to each other. FIGS. 5B and 6B illustrate the formation of conductive layer 34 in accordance with alternative embodiments. These embodiments are similar to the embodiments in FIGS. 2 through 6A, except the formation of conductive plate 28, sacrificial layer 30 (FIG. 6B), and the overlying connecting via 36 is skipped. As shown in FIG. 5B, dielectric layer 26 is formed first. Next, conductive layer 34, vias 36, and bond layer 38 are formed. Also for controlling the flatness and the morphology of the top surface of sacrificial layer 26, a CMP process may be adopted. The details of the formation process may be found in the embodiments shown in FIGS. 2 through 6A.

Figure 7:
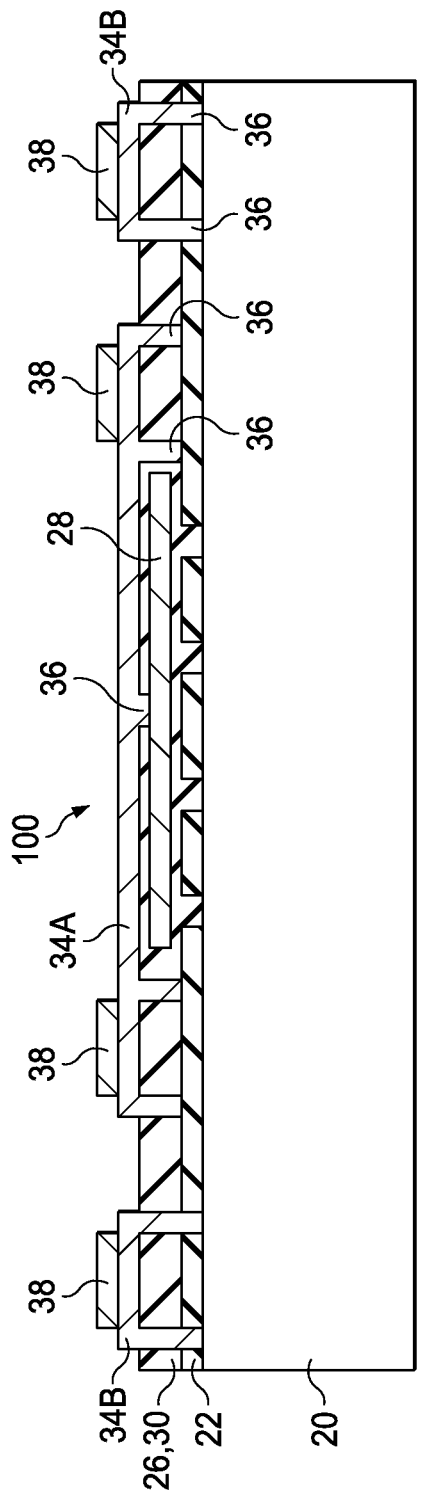

In FIG. 7, conductive layer 34 is patterned. The remaining portions of conductive layer 34 include 34A and 34B. Portion 34A is electrically connected to conductive plate 28, and is insulated from substrate 20 by sacrificial layer 26. Portions 34B may be electrically coupled to substrate 20 through conductive vias 36. Throughout the description, portion 34A is referred to membrane 34A.

Figure 8:
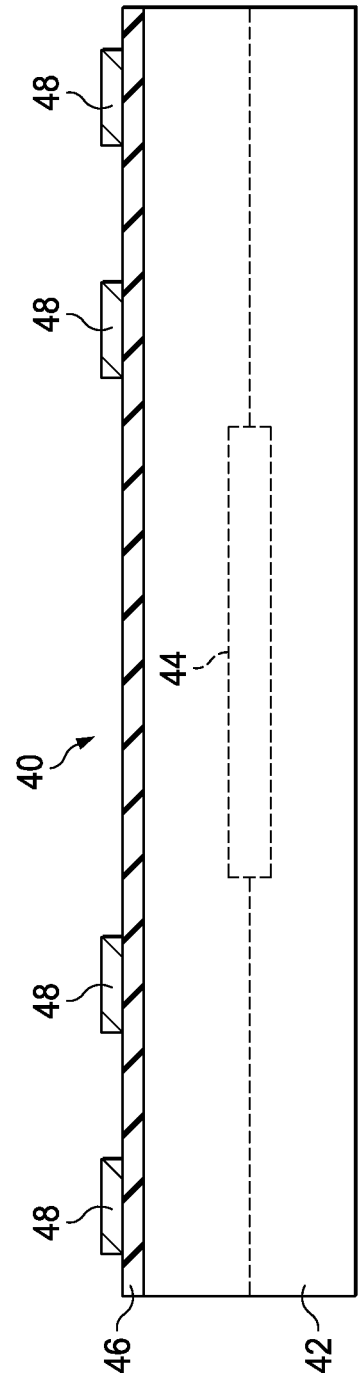

FIG. 8 illustrates the preparation of wafer 40. Wafer 40 may be a semiconductor wafer. In some embodiments, wafer 40 includes substrate 42, which may be a silicon substrate. Active circuits such as Complementary Metal-Oxide-Semiconductor (CMOS) devices 44 may be formed at a surface of substrate 42. In alternative embodiments, wafer 40 may be a blanket wafer formed of, for example, bulk silicon, wherein no active circuits are formed in wafer 40. Dielectric layer 46 is formed on a surface of wafer 40. Dielectric layer 46 may be formed of the same material as dielectric layer 22 (FIG. 1), which may be silicon nitride, SiC, diamond-like carbon, or the like.

Bond layer 48 is formed on dielectric layer 46, and is patterned into a plurality of separate portions. The sizes and the positions of the remaining bond layer 48 may match the sizes and positions of bond layer 38 (FIG. 7). Bond layer 48 is formed of a material that may form a eutectic alloy with bond layer 38. Accordingly, bond layer 48 may comprises a germanium layer, an indium layer, a gold layer, or a tin layer. Alternatively, bond layer 48 may be a composition layer having a plurality of stacked layers including two or more of a germanium layer, an indium layer, a gold layer, and a tin layer. Bond layer 48 may also include aluminum. Germanium and/or gold may form eutectic alloy with aluminum, and gold may formed eutectic alloy with tin. Accordingly, the materials of bond layer 38 and bond layer 48 are selected correspondingly, so that after a eutectic bonding, bond layer 38 and bond layer 48 form a eutectic alloy. For example, the Al—Ge eutectic bonding may be used for performing a low temperature bonding. In an embodiment, an Al—Ge eutectic bonding temperature may be at between about 410° C. and about 440° C. when the germanium atomic percentage in the Al—Ge alloy is between about 28 percent and about 33 percent.

Figure 9:
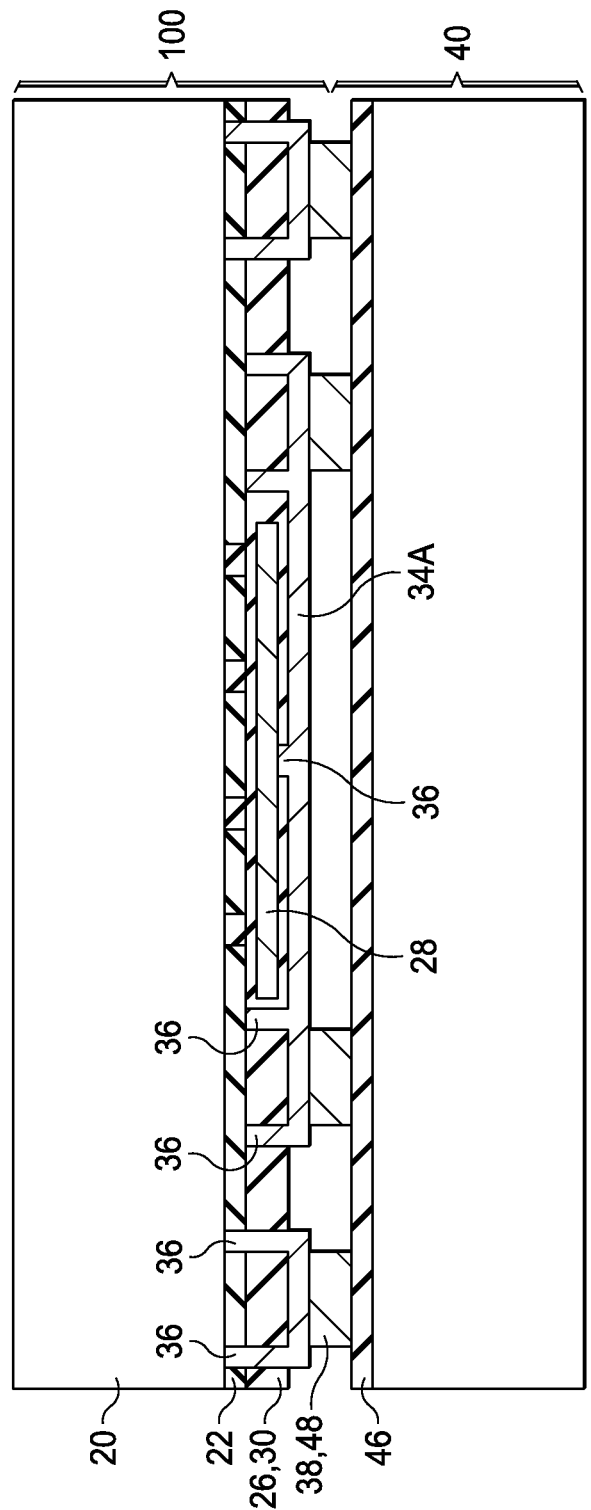

Referring to FIG. 9, wafer 40 is bonded to wafer 100. During the bonding process, bond layers 38 and 48 react with each other in a eutectic reaction, and are liquefied to form an eutectic alloy at a specific temperature. The resulting eutectic alloy is referred to as 38/48 hereinafter. During the bonding process, a force is also applied to push bond layers 38 and 48 against each other. The liquid alloy is then solidified when the temperature is lowered.

Figure 10:
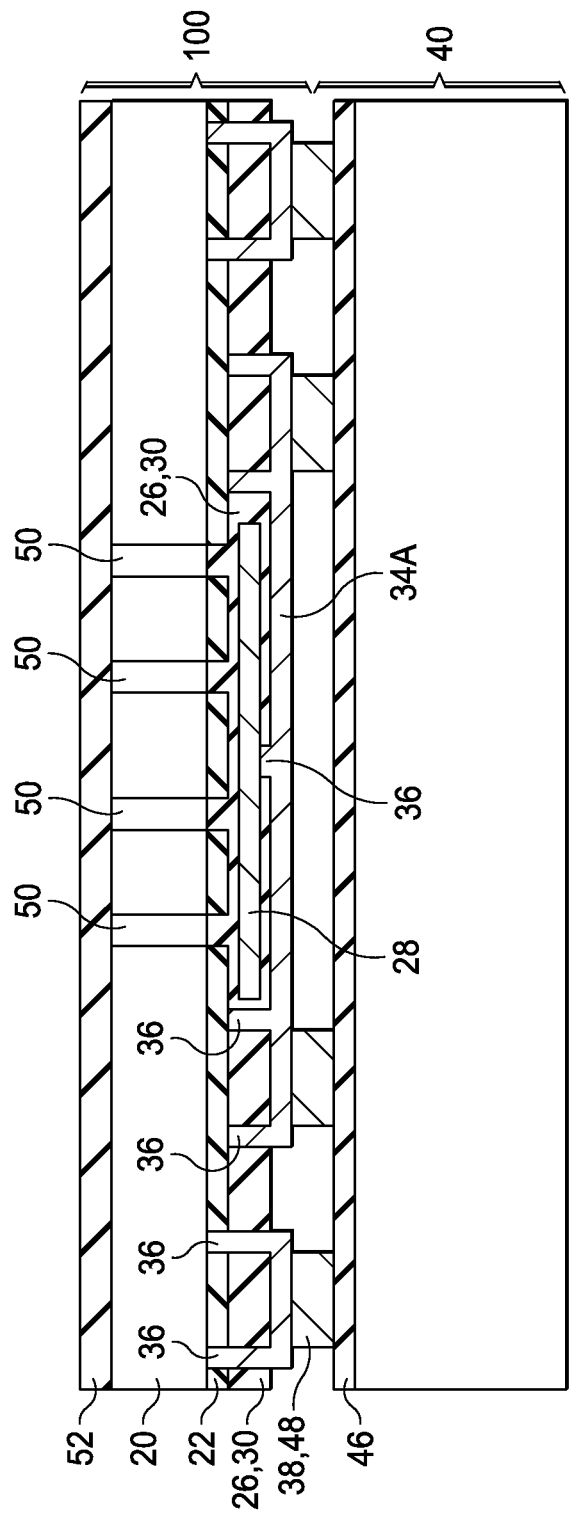

In FIG. 10, substrate 20 is thinned from the backside, for example, through a grinding step or a CMP. An etching step is then performed to etch substrate 20 to form through-openings 50. In some embodiments, through-openings 50 are aligned to some of openings 24 (FIG. 1). The etchant for the etching may be selected not to attack dielectric layer 22. Through-openings 50 may act as the acoustic holes in some embodiments. Dielectric layer 52, which may be an oxide layer or a polymer film, is then formed on the surface of substrate 20, for the anti-scratching protection during the wafer handling in subsequent process steps.

Figure 11:
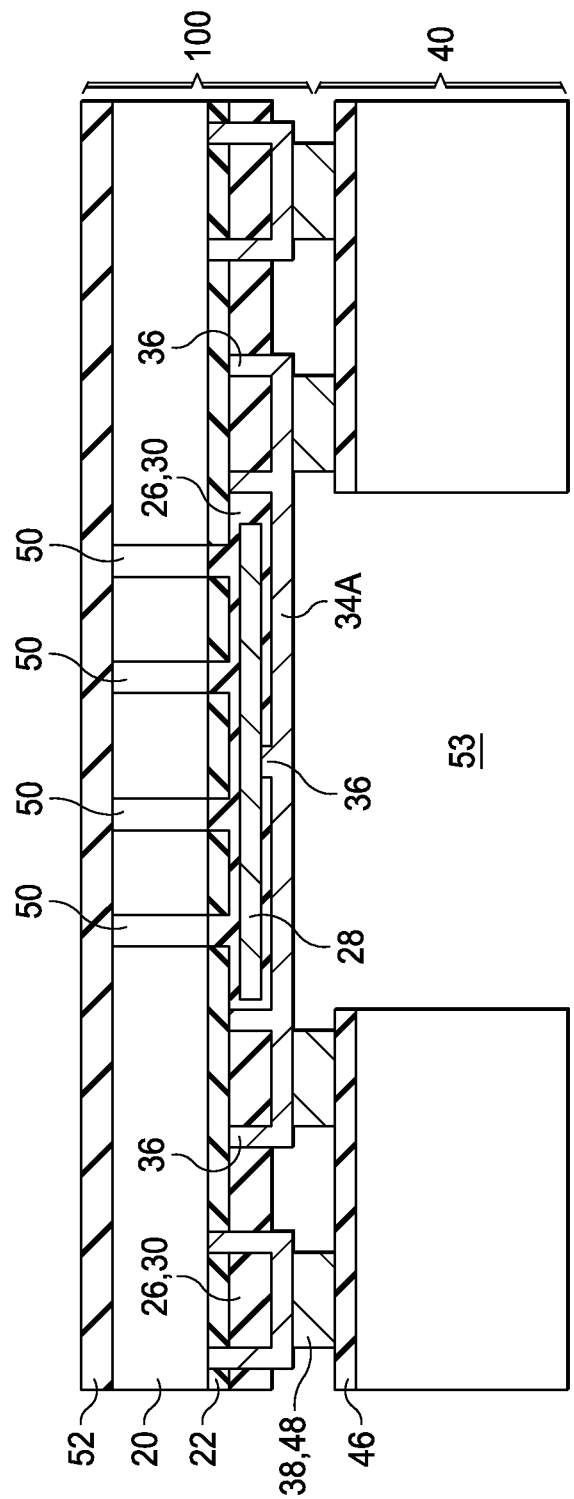

Next, as shown in FIG. 11, through-opening 53 is formed in wafer 40, wherein wafer 40 is etched through. Opening 53 is a large opening that overlaps conductive plate 28. At least a portion of membrane 34 is exposed to opening 53.

Figure 12A:
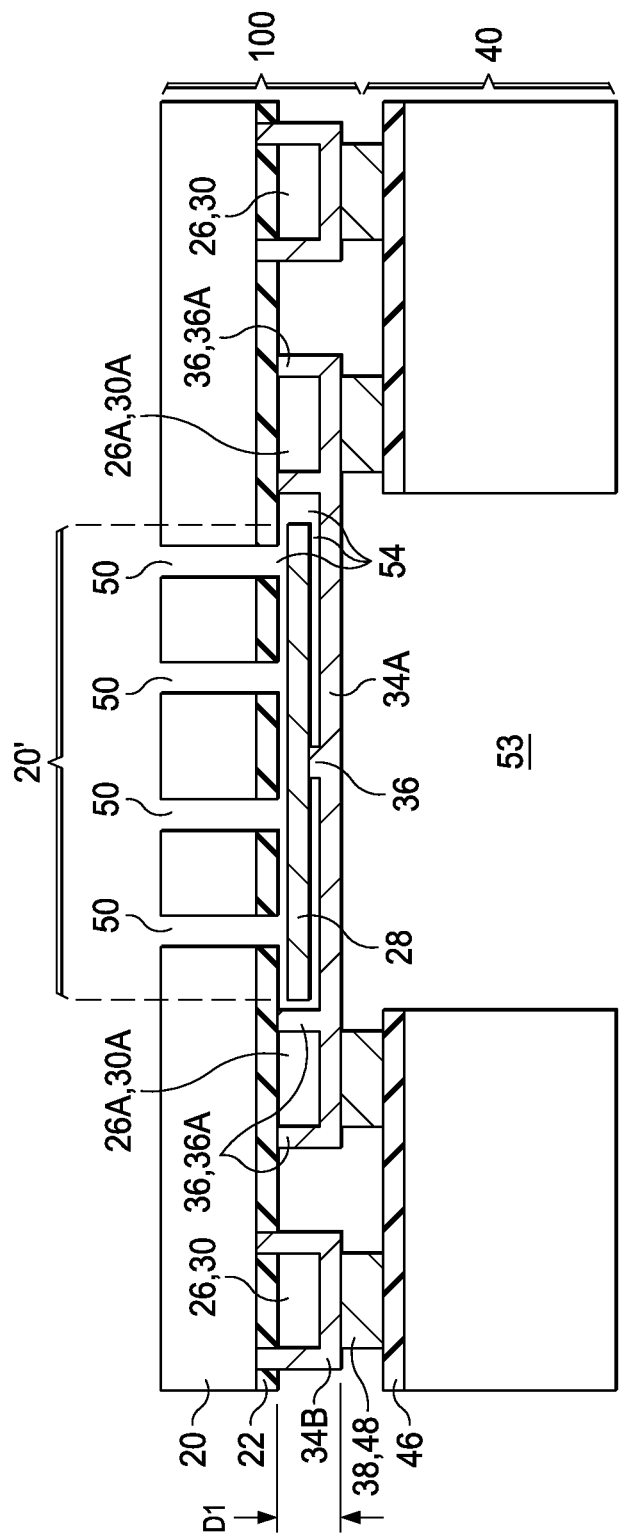
Figure 12B:
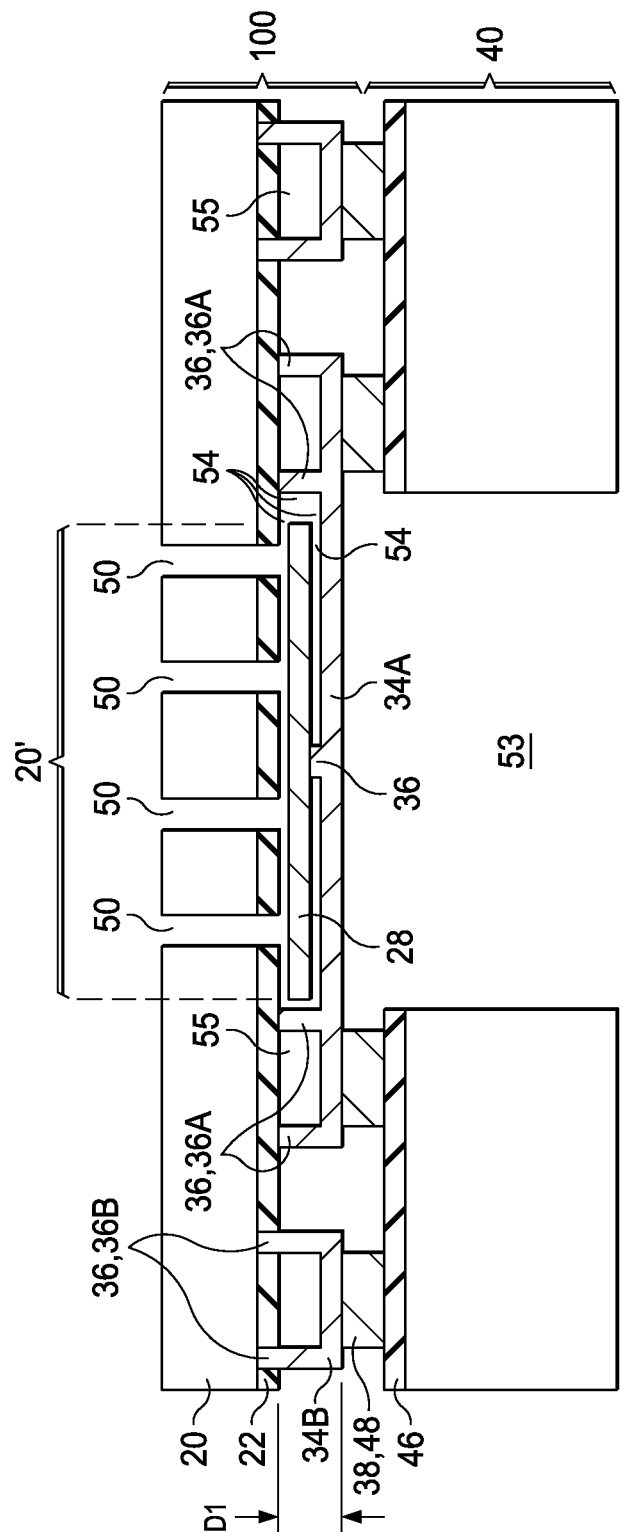

FIGS. 12A and 12B illustrate the removal of sacrificial layers 26 and 30. In some embodiments, sacrificial layer 26 is formed of silicon oxide, and hence may be etched using vapor HF. Alternatively, a HF solution such as BOE is used. In some embodiments, as shown in FIG. 12A, vias 36A may form full rings, so that the portions of sacrificial layers 26 and 30 (denoted as 26A/30A) encircled between via rings 36A are left un-etched, while other portions of sacrificial layers 26 and 30 are etched to form air-gap 54. In alternative embodiments, as shown in FIG. 12B, substantially all portions of sacrificial layers 26 and 30 that overlap membrane 34A are etched. Accordingly, air-gaps 55 are formed between polysilicon vias 36A. After the removal of sacrificial layers 26 and 30, conductive plate 28 may be spaced apart from substrate 20 (and dielectric layer 22) by air-gap 54. Accordingly, conductive plate 28 forms one capacitor plate of a capacitor, which may function as a capacitor sensor, and is a part of a MEMS device. Substrate 20 forms the other capacitor plate. The portion of substrate 20 that overlaps conductive plate 28 is referred to as back-plate 20' hereinafter. Although not shown, electrical connections are made to connect to membrane 34A and back-plate 20', so that the capacitance of the capacitor formed of membrane 34A and back-plate 20' may be sensed.

In the embodiments shown in FIGS. 12A and 12B, it is observed that membrane 34A is supported by the 36A via rings (which is alternatively referred as an anchor) and the overlapped area between the via rings 36A and back-plate 20' could be minimized to reduce the parasitic capacitance therebetween.

Figure 13:
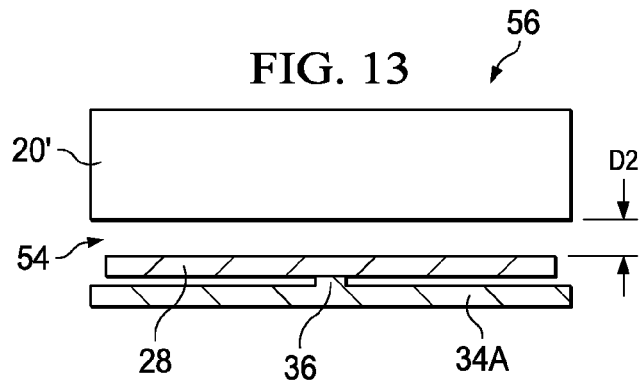
FIGS. 13 and 14 illustrate the operation of a capacitive sensor in accordance with some embodiments.
Figure 14:
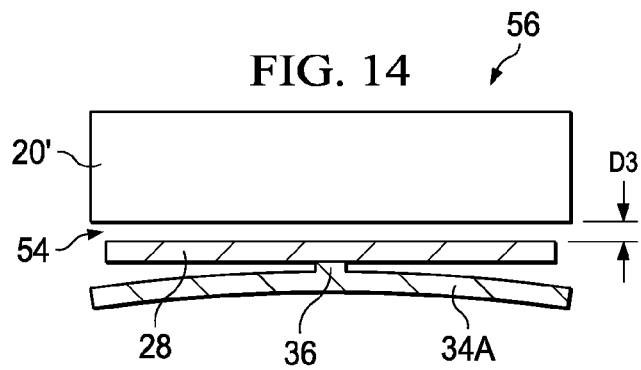

FIGS. 13 and 14 illustrate the work mechanism of capacitive sensor 56, which includes conductive plate 28, back-plate 20', and air-gap 54 therebetween. Referring to FIG. 13, when membrane 34A is at its normal position (not curved), the distance between conductive plate 28 and back-plate 20' is D2, wherein distance D2 is also the thickness of the capacitor insulator, which is the portion of air-gap 54 between membrane 34A and back-plate 20'. When membrane 34A moves toward or away from back-plate 20', conductive plate 28 moves in response to the movement of membrane 34A. The distance between conductive plate 28 and back-plate 20' thus becomes D3. The capacitance of capacitor sensor 56 thus increases or reduces, depending on the movement direction of membrane 34. It is observed that by forming conductive plate 28 that is attached to membrane 34, when membrane 34 moves and becomes curved, conductive plate 28 may remain substantially planar. The capacitance of capacitive sensor 56 is thus more linear to the movement distance (D3−D2) than if membrane 34 is used as the capacitor plate, as shown in FIGS. 16 and 17.

Figure 6B:
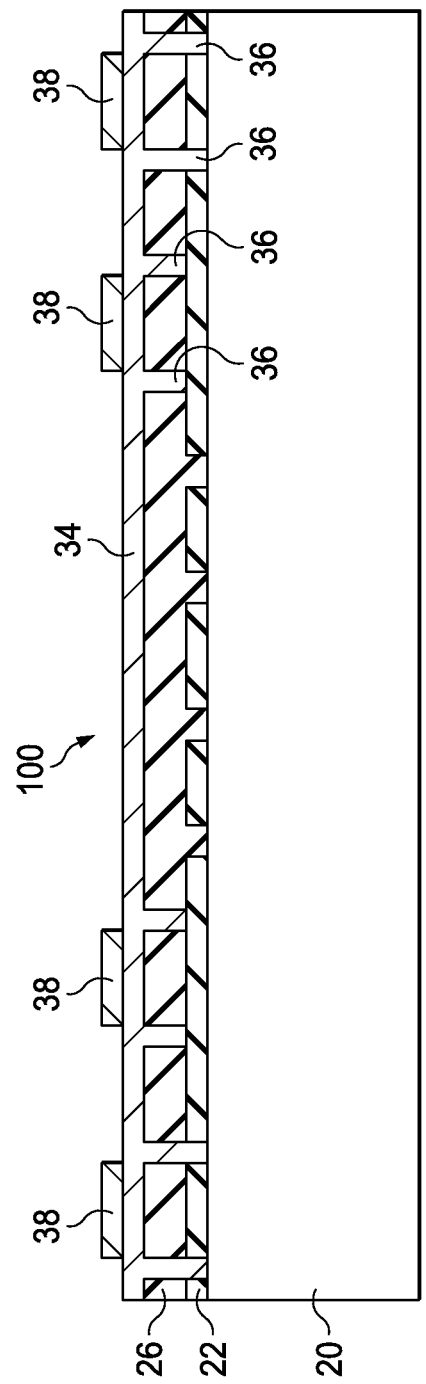
Figure 16:
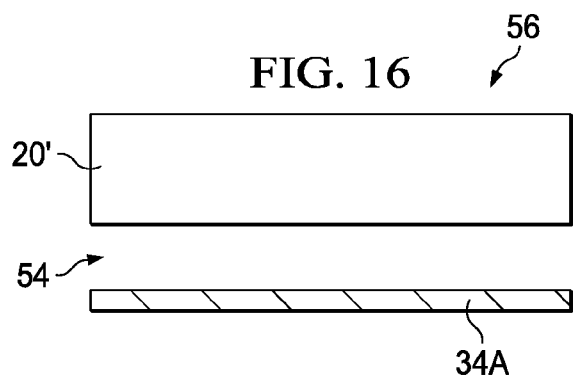
FIGS. 16 and 17 illustrate the operation of the capacitive sensor in FIG. 15 in accordance with some embodiments.
Figure 17:
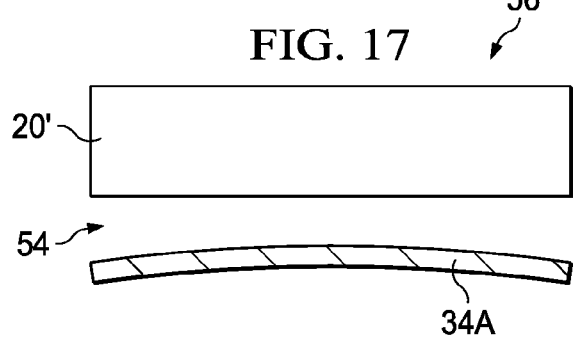
Figure 15:
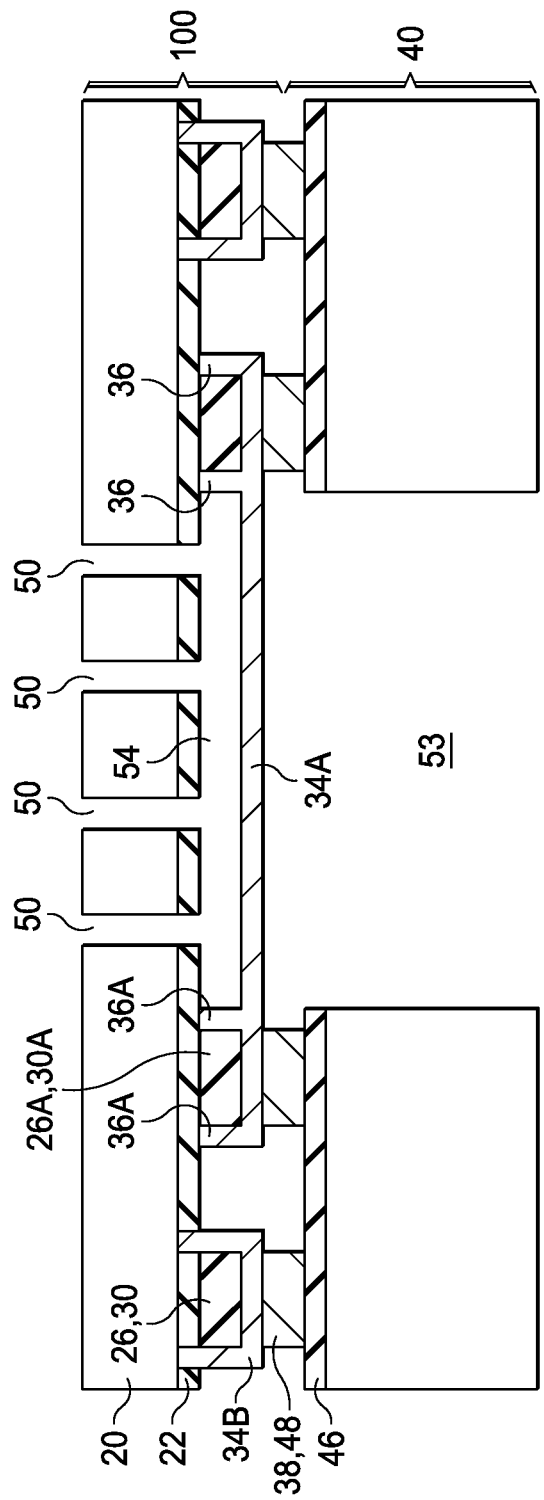
FIG. 15 illustrates a capacitive sensor in accordance with alternative embodiments.

FIGS. 15 through 17 illustrate the structures in accordance with alternative embodiments, wherein the structure shown in FIG. 15 is obtained from the structure shown in FIG. 6B. FIGS. 16 and 17 illustrate the change in the positions and shape of membrane 34A, which is used as one of the capacitor plate. Comparing FIGS. 12A through 14 with FIGS. 15 through 17, it is observed that the capacitor shown in FIGS. 12A and 12B have greater capacitance-change sensitivity than the capacitor in FIG. 15, wherein the capacitance-change sensitivity reflects the sensitivity of the capacitance change in response to the change in the distance between capacitor plates.

In the embodiments, wafer 100 (FIGS. 12A, 12B, and 15) are used as the back-plate of the capacitive sensors. Wafer 100 may be a bulk wafer that is thinned to a desirable thickness. Accordingly, the thickness of substrate 20 in FIGS. 12A, 12B, and 15 may be adjusted to a desirable value. The air r resistance in openings 50 may thus be set to a desirable vale by adopting an appropriate thickness of substrate 20. Therefore, in the embodiments, it is not necessary to adjust the size of openings 50. For one of the exemplary applications, the embodiments (FIGS. 12A, 12B, and 15) are suitable for acoustic capacitive sensing with optimized structure design.

In accordance with embodiments, a device includes a semiconductor substrate, and a capacitive sensor having a back-plate, wherein the back-plate forms a first capacitor plate of the capacitive sensor. The back-plate is a portion of the semiconductor substrate. A conductive membrane is spaced apart from the semiconductor substrate by an air-gap. A capacitance of the capacitive sensor is configured to change in response to a movement of the conductive membrane.

In accordance with other embodiments, a device includes a first silicon substrate, a dielectric layer on the first silicon substrate, and a polysilicon via and a polysilicon membrane. The polysilicon membrane is anchored on the dielectric layer through the polysilicon via. The polysilicon membrane is configured to move in directions toward and away from the first silicon substrate. The device includes a second silicon substrate having a through-opening overlapping a portion of the polysilicon membrane, wherein the first and the second silicon substrates are on opposite sides of the polysilicon membrane. A eutectic alloy is bonded to the polysilicon membrane, wherein the eutectic alloy is disposed between the polysilicon membrane and the second silicon substrate.

In accordance with yet other embodiments, a method includes forming a first and a second component. The formation of the first component includes forming a first dielectric layer over a first silicon substrate, forming a sacrificial layer over the first dielectric layer, and forming a polysilicon membrane and a conductive via over the sacrificial layer. The conductive via is between the first dielectric layer and the conductive membrane, wherein the conductive via extends into the sacrificial layer. The method further includes forming a first bond layer having a portion over the first silicon substrate. The formation of the second component includes forming a second dielectric layer over a second silicon substrate, and forming a second bond layer over the second dielectric layer. The first component and the second component are bonded to each other through the bonding of the first bond layer to the second bond layer. Portions of the sacrificial layer between the conductive membrane and the first dielectric layer are removed to form an air-gap, wherein the conductive membrane is configured to move in the air-gap.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    forming a first component comprising:
        forming a first dielectric layer over a first silicon substrate;
        forming a sacrificial layer over the first dielectric layer;
        forming a polysilicon membrane and a first conductive via over the sacrificial layer, wherein the first conductive via is between the first dielectric layer and the polysilicon membrane, and wherein the first conductive via extends into the sacrificial layer;
        forming a first bond layer comprising a portion over the first silicon substrate;
    forming a second component comprising:
        forming a second dielectric layer over a second silicon substrate; and
        forming a second bond layer over the second dielectric layer;
    bonding the first component and the second component by bonding the first bond layer to the second bond layer; and
    removing portions of the sacrificial layer between the polysilicon membrane and the first dielectric layer to form an air-gap, wherein the polysilicon membrane is configured to move in the air-gap.

2. The method of claim 1 further comprising:
before the forming the polysilicon membrane and the first conductive via, forming a conductive plate over the first dielectric layer, wherein the conductive plate is spaced apart from the first dielectric layer by a portion of the sacrificial layer; and
forming an additional conductive via connecting the polysilicon membrane to the conductive plate.

3. The method of claim 2, wherein the portion of the sacrificial layer is removed during the step of removing the portions of the sacrificial layer.

4. The method of claim 1 further comprising etching the second component to form a through-opening, wherein the through-opening overlaps a portion of the polysilicon membrane.

5. The method of claim 1, wherein the first bond layer and the second bond layer are bonded to each other through eutectic bonding.

6. The method of claim 1 further comprising:
grinding the first silicon substrate; and
forming a through-hole in the first silicon substrate after the step of grinding, wherein the through-hole is connected to the air-gap.

7. The method of claim 1 further comprising:
before the forming the sacrificial layer, patterning the first dielectric layer to form an opening;
forming a conductive region at a same level as the polysilicon membrane; and
forming a second conductive via, wherein the second conductive via electrically connects the conductive region to the first silicon substrate, and wherein the second conductive via extends into the opening.

8. A method comprising:
forming a first sacrificial layer over a semiconductor substrate;
forming a conductive plate over the first sacrificial layer;
forming a second sacrificial layer over the conductive plate;
patterning the first sacrificial layer and the second sacrificial layer to form via openings, wherein the conductive plate and the semiconductor substrate are exposed through the via openings;
forming a conductive layer over the second sacrificial layer, wherein the conductive layer comprises a first portion filling the via openings, and a second portion connected to the conductive plate;
patterning the conductive layer to disconnect the first portion and the second portion of the conductive layer from each other; and
removing the first sacrificial layer to form a capacitor, with the conductive plate and the semiconductor substrate forming two capacitor plates of the capacitor.

9. The method of claim 8, wherein the first sacrificial layer is formed on a first side of the semiconductor substrate, and wherein the removing the first sacrificial layer comprises:
forming an opening penetrating through the semiconductor substrate; and
etching the first sacrificial layer and the second sacrificial layer from a second side of the semiconductor substrate, wherein the etching the first sacrificial layer and the second sacrificial layer is performed through the opening.

10. The method of claim 8, wherein the forming the conductive layer comprises depositing a polysilicon layer.

11. The method of claim 8 further comprising:
forming a bond layer on the conductive layer; and
bonding a wafer to the bond layer.

12. The method of claim 11, wherein the wafer comprises a silicon substrate.

13. The method of claim 11 further comprising forming a through-opening penetrating through the wafer, wherein the through-opening is aligned to the conductive plate.

14. The method of claim 8, wherein after the removing the first sacrificial layer, the second portion of the conductive layer is configured to be moveable along with the conductive plate.

15. A method comprising:
forming a dielectric layer over a semiconductor substrate;
forming a sacrificial layer over the dielectric layer;
patterning the sacrificial layer and the dielectric layer to form via openings filled with vias, wherein the semiconductor substrate is exposed through the via openings;
forming a conductive layer over the sacrificial layer;
patterning the conductive layer to separate a first portion from a second portion of the conductive layer from each other, wherein the first portion is electrically coupled to the semiconductor substrate; and
removing the sacrificial layer to form an air-gap separating the second portion of the conductive layer from the semiconductor substrate.

16. The method of claim 15, wherein the forming the sacrificial layer comprises:
forming a first sacrificial layer over the dielectric layer; and
forming a second sacrificial layer over the first sacrificial layer, wherein the method further comprises forming a conductive plate between the first sacrificial layer and the second sacrificial layer, and wherein the conductive plate is electrically coupled to the second portion of the conductive layer.

17. The method of claim 16, wherein the sacrificial layer is formed on a first side of the semiconductor substrate, and wherein the removing the sacrificial layer comprises:
forming an opening penetrating through the semiconductor substrate; and
etching the first sacrificial layer and the second sacrificial layer through the opening.

18. The method of claim 15, wherein the forming the conductive layer comprises depositing a polysilicon layer.

19. The method of claim 15 further comprising:
forming a bond layer on the conductive layer; and
bonding a wafer to the bond layer.

20. The method of claim 19 further comprising forming a through-opening penetrating through the wafer, wherein the through-opening is aligned to the second portion of the conductive layer.

* * * * *